(12) United States Patent
Balma

(10) Patent No.: US 11,435,766 B2
(45) Date of Patent: Sep. 6, 2022

(54) FINE-GRAIN DYNAMIC SOLID-STATE COOLING SYSTEM

(71) Applicant: Jacob A. Balma, Hugo, MN (US)

(72) Inventor: Jacob A. Balma, Hugo, MN (US)

(73) Assignee: Maxwell Labs Inc, Minneapolis, MN (US)

( * ) Notice: Subject to any disclaimer, the term of this patent is extended or adjusted under 35 U.S.C. 154(b) by 227 days.

(21) Appl. No.: 16/564,216

(22) Filed: Sep. 9, 2019

(65) Prior Publication Data

US 2020/0081464 A1 Mar. 12, 2020

Related U.S. Application Data

(60) Provisional application No. 62/728,196, filed on Sep. 7, 2018.

(51) Int. Cl.
*G05D 23/19* (2006.01)
*F25B 21/02* (2006.01)
*H01L 33/64* (2010.01)
*H05K 1/02* (2006.01)
*H01L 37/00* (2006.01)

(52) U.S. Cl.
CPC ......... *G05D 23/1934* (2013.01); *F25B 21/02* (2013.01); *F25B 2321/0212* (2013.01); *H01L 33/645* (2013.01); *H01L 37/00* (2013.01); *H05K 1/0203* (2013.01)

(58) Field of Classification Search
CPC ................. G05D 23/1934; F25B 21/02; F25B 2321/0212
See application file for complete search history.

(56) References Cited

U.S. PATENT DOCUMENTS 5,349,821 A * 9/1994 Schrage ................ F24F 5/0042
62/3.2
6,711,904 B1 3/2004 Law et al.
(Continued)

FOREIGN PATENT DOCUMENTS

WO 2008088306 A2 7/2008

OTHER PUBLICATIONS

International Search Report and Written Opinion dated Dec. 6, 2019 for International Application No. PCT/US2019/050167 filed Sep. 9, 2019, 11 pages.

*Primary Examiner* — Larry L Furdge
*Assistant Examiner* — Alexis K Cox
(74) *Attorney, Agent, or Firm* — Leanne Taveggia Farrell; Westman, Champlin & Koehler, P.A.

(57) ABSTRACT

A cooling system includes a controller, a plurality of sensor sub-units, a plurality of solid-state cooling sub-units and a heat exchanger. The sensor sub-units are configured to be thermally connected to a heat source. The heat source has a plurality of sub-regions that correspond with each of the sensor sub-units. Each solid-state cooling sub-unit corresponds with and thermally connects to one of the sensor sub-units and is configured to dissipate heat from the sub-regions of the heat source. The heat exchanger is configured to dissipate heat from the sub-regions of the heat source and waste heat. The controller, based on temperatures sampled from the plurality of sensor sub-units and predictions made by an optimizer, is configured to determine the one or more sub-regions of the heat source to cool.

15 Claims, 10 Drawing Sheets

(56) References Cited

U.S. PATENT DOCUMENTS

| | | | |
|---|---|---|---|
| 2004/0233641 A1* | 11/2004 | Moshayedi | H01L 23/5387 361/716 |
| 2005/0067158 A1* | 3/2005 | Ito | B60H 1/00885 165/204 |
| 2005/0091989 A1 | 5/2005 | Leija et al. | |
| 2005/0134827 A1* | 6/2005 | Box | G03F 7/70783 355/72 |
| 2006/0120036 A1* | 6/2006 | Rockenfeller | H05K 7/20836 361/688 |
| 2008/0170982 A1* | 7/2008 | Zhang | D01F 9/1273 423/447.3 |
| 2009/0321909 A1* | 12/2009 | Gu | H01L 23/38 257/686 |
| 2014/0312828 A1* | 10/2014 | Vo | H02J 7/0024 429/7 |

\* cited by examiner

FINE-GRAIN DYNAMIC SOLID-STATE COOLING SYSTEM

CROSS-REFERENCE TO RELATED APPLICATION

The present application is based on and claims the benefit of U.S. provisional patent application Ser. No. 62/728,196, filed Sep. 7, 2018, the contents of which are hereby incorporated by reference in their entireties.

BACKGROUND

A solid-state heat pump device transfers heat from one side of a device to the other and is used primarily for cooling. One type of solid-state heat pump is a thermoelectric cooler, which operates by the Peltier effect or thermoelectric effect. The thermoelectric cooler has two sides and when an electric current flows through the device, it brings heat from one side to the other so that one side gets cooler while the other gets hotter.

The discussion above is merely provided for general background information and is not intended to be used as an aid in determining the scope of the claimed subject matter.

SUMMARY

A cooling system includes a controller; a plurality of sensor sub-units arranged in a grid and configured to be thermally connected to a heat source and a plurality of solid-state cooling sub-units arranged in a grid. The heat source has a plurality of sub-regions that correspond with each of the sensor sub-units. Each solid-state cooling sub-unit includes a cold side and a hot side and each solid-state cooling sub-unit corresponds with one of the plurality of sensor sub-units. The cold side of each solid-state cooling sub-unit thermally connects to one of the sensor sub-units and is configured to dissipate heat from the sub-regions of the heat source. A heat exchanger thermally connects to the hot side of each of the solid-state cooling sub-units and is configured to dissipate additional heat from the sub-regions of the heat source and waste heat generated from powering the solid-state cooling sub-units. The controller, based on temperatures sampled from the plurality of sensor sub-units and predictions made by an optimizer, is configured to determine the one or more sub-regions of the heat source to cool.

A method of cooling a heat source is provided. A plurality of solid-state cooling sub-units arranged in a grid are provided. Each solid-state cooling sub-unit includes a cold side and a hot side. A plurality of sensor sub-units thermally connected to the cold sides of the plurality of solid-state cooling sub-units are provided. Each sensor sub-unit corresponds with one of the solid-state cooling sub-units. Using a controller, temperatures of the plurality of sensor sub-units are sampled. Each sensor sub-unit is configured to be thermally connected to one of a plurality of sub-regions of a heat source. The temperatures of each of the sensor sub-units are routed to an optimizer. Cooling of selective one or more sub-regions of the heat source is done by dynamically adjusting power to one or more of the solid-state cooling sub-units based on the optimizer. Power is applied to the one or more solid-state cooling sub-units that correspond with the one or more sub-regions to cool.

A cooling system includes a controller, a plurality of sensor sub-units arranged in at least one sensor mesh, a plurality of solid-state cooling sub-units arranged in at least one cooler mesh that is stacked together with the at least one sensor mesh and a heat exchanger thermally connected to the stacked at least one sensor mesh and at least one cooler mesh. The at least one cooler mesh is configured to be thermally connected to a heat source. The heat source has a plurality of sub-regions that correspond with each of the sensor sub-units. Each solid-state cooling sub-unit includes a cold side and a hot side and each solid-state cooling sub-unit corresponds with one of the plurality of sensor sub-units. The cold side of each solid-state cooling sub-unit thermally connects to one of the sensor sub-units and is configured to dissipate heat from the sub-regions of the heat source. The heat exchanger is configured to dissipate additional heat from the sub-regions of the heat source and waste heat generated from powering the solid-state cooling sub-units. The controller, based on temperatures sampled from the plurality of sensor sub-units and predictions made by an optimizer, is configured to determine the one or more sub-regions of the heat source to cool.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DETAILED DESCRIPTION

Figure 1:
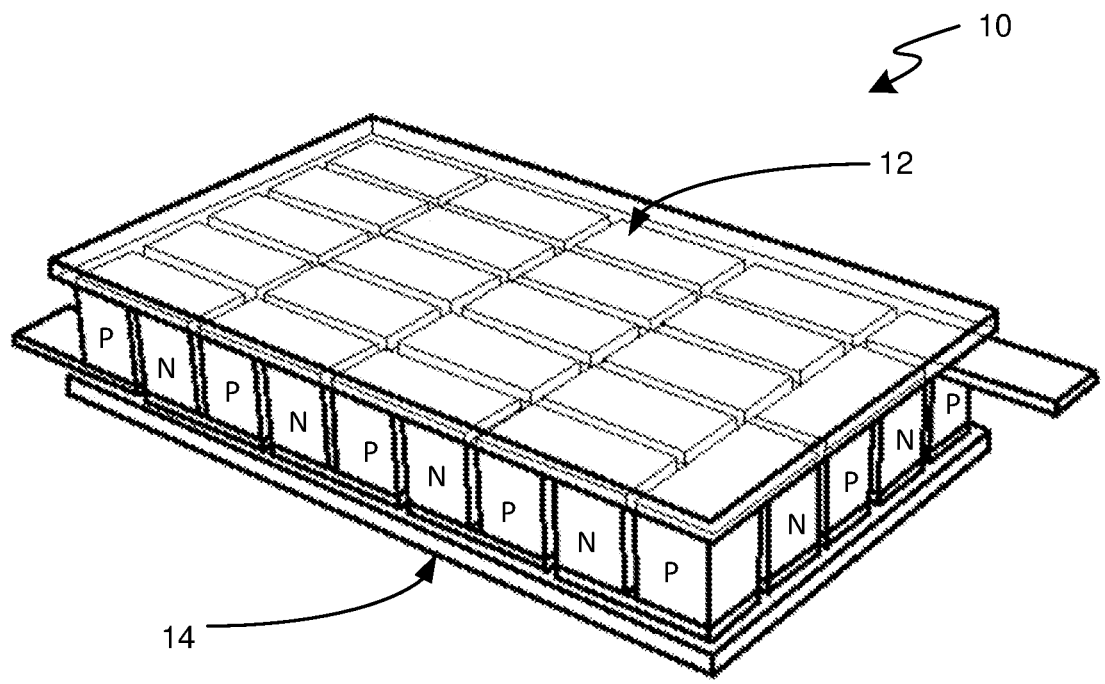
FIG. 1 illustrates a schematic diagram of an exemplary solid-state cooling unit.

The heat dissipation requirements of hardware in modern servers, for example, a CPU, a GPU, memory, a chipset and a power module, impose hard limits on the rate of information processed using silicon-based microprocessor technology. For this reason, microprocessors have been adding cores and increasing vector unit widths without substantial increases in clock rate for several years in an attempt to expand Moore's Law into the future.

Extreme cooling solutions are applied in high-performance computing applications in order to run memory, CPUs, and GPUs at or near the maximum clock rates allowed while remaining under Total Design Power (TDP) of any given hardware. TDP is a function of the thermal constraints imposed by the material, manufacturing process, voltage and frequency of CMOS technology.

The energy of a bit represented by a set of N CMOS transistors is:

$$E_{CMOS} = \tfrac{1}{2} NCV^2$$

Where C is the gate capacitance, V is the supply of voltage and N is the number of transistors required to store a bit in the circuit.

Power consumption P and therefore heat production is known to be a non-linear function of voltage V and clock frequency f:

$$P = \alpha CV^2 f + I_{leds} V$$

where the equation does not account for the spatial distribution of the power to be dissipated. Instead, it applies a constant activity factor, which is represented by $\alpha$. The factor $\alpha$ is used to scale the predicted power by the fraction of "active" transistors in the circuit at any given clock cycle. The rate that these active transistors do useful work is driven by the clock frequency (f), which scales the power requirements as it increases. If the resulting power increase can be dissipated, the clock speed can be increased indefinitely.

The above power consumption equation also assumes that all active transistors making up each component of the chip equally carry the same number of charges and do equal work. However, the true power distribution in a given microprocessor does not produce heat equally across all active transistors because the transistor-density across the surface of the chip varies by the intended functionality of groups of transistors. Some transistors might act as memory, while others act as functional units. In fact, only a small percentage of the active transistors are responsible for most of the heat dissipation in any given CPU/GPU architecture, and these are highly localized and specific to the type of computation and memory activity a given workload requires. These transistors are the ones which are combined to form units which perform arithmetic functions, and are usually referred to as Floating Point Multiply-Add (FMA) units.

FMA units consist of a set of transistors which form the logical basis for doing arithmetic functions, but also have some number set aside to be used as registers, which are responsible for storing the bits that represent numbers to be acted on by the FMA circuit logic. Because these are non-reversible computations, most of the energy (in the form of electrical charges) used to store the bits on the input and output of the FMA unit must be dropped to ground each clock cycle (occurring at clock frequency). This is where most of the waste-heat is produced by modern processors.

The main approaches to cooling in these situations are liquid-based or fan-based. Traditional air-cooling (fan-based) systems cannot lower the temperature of transistors (specifically the FMA units) below the ambient temperature of the air surrounding the CPU/GPU. Liquid cooling solutions overcome this issue but are expensive and difficult to apply in practice. The simplicity and cost of Fan-based cooling is juxtaposed against the benefits of liquid cooling systems which are able to reduce the temperatures of the entire chip below ambient, but are expensive to apply and still limited by the freezing point of the coolant (usually water).

Various attempts have been made to apply solid-state cooling (e.g. Peltier/Thermo-Electric effect) across entire chips. Thermo-Electric Coolers (TECs) were utilized to create a thermal reservoir, which is far below the freezing-point of water, and therefore still have potential in supplementing low-cost fan-based approaches to hardware cooling solutions which offer competitive performance to liquid cooling solutions while being far cheaper and less complicated to apply in practice. However, these attempts were found to be too inefficient to be used in practice because they required significant power to lower the temperature below ambient, and create additional waste heat that must be dissipated alongside the CPU/GPU waste heat.

FIG. 1 illustrates a schematic diagram of an exemplary solid-state cooling unit 10. Solid-state cooling unit 10 may be a thermoelectric cooler (TEC) which exchanges power for creating a temperature gradient between two pieces of ceramic. In FIG. 1, two semiconductors, one n-type and one p-type, are used that have different electron densities. The alternating p-type and n-type semiconductor pillars are placed thermally in parallel to each other and electrically in series and then joined with a thermally conducting plate on each side 12 and 14.

One side 12 gets hot and the other side 14 gets proportionally colder. The cold side 14 acts as a thermal reservoir into which heat can flow, while the hot side 12 dissipates the difference in heat between the ambient environment and cold side 12 back to the environment. The maximum temperature difference between the two sides 12 and 14 is ~70° C. Typically a heat exchanger will be used to aid in distributing the heat from hot side 14 into the environment. When applied to electronics cooling, this means the hot side of the thermoelectric cooling unit 10 must dissipate the heat removed to create the reservoir, in addition to whatever waste heat is produced by the targeted electronics.

The primary drawback to solid-state cooling units in power-constrained environments is efficiency. Solid-state cooling units have only been 10-15% efficient in taking the power they draw and turning it into a cold reservoir. Embodiments of a fine-grain dynamic solid-state cooling system as described herein is a solution to the efficiency problems associated with traditional thermoelectric cooling systems. The cooling units described herein and when combined with a properly designed heat-sink (which on its own can dissipate 100 W just through natural convection) can be nearly 60% efficient, allowing the described cooling units to compete as extreme cooling solutions for CPU hardware. Recent advances in solid-state technology have further improved the heat pumping capabilities by up to 60% with less than 30% power. Because previous TEC-based systems have been shown, when stacked vertically (cold side atop another units hot side) to be capable of reaching −100° C., when combined with the assumed 60% improvement gains in heat pumping capabilities, temperatures of −160° C. are now practical and push solid-state superconducting devices and materials into the realm of possibility.

Embodiments described herein combine solid-state cooling technology, data-driven optimization techniques used in deep learning, sensor devices and novel materials for thermal energy transfer and radiation and aim to make solid-state superconducting microprocessors, memory and power systems a reality by combining state-of-the-art technology in deep learning, solid-state cooling units, and radiative materials to provide a means to achieve optimal dissipation of heat from arbitrary sources and in such a way as to make multiple materials simultaneously reach their corresponding critical temperatures, such as necessary to achieve superconducting states. By providing a development system for implementation of such devices, the landscape of possibilities will expand quickly and with powerful repercussions.

Figure 2:
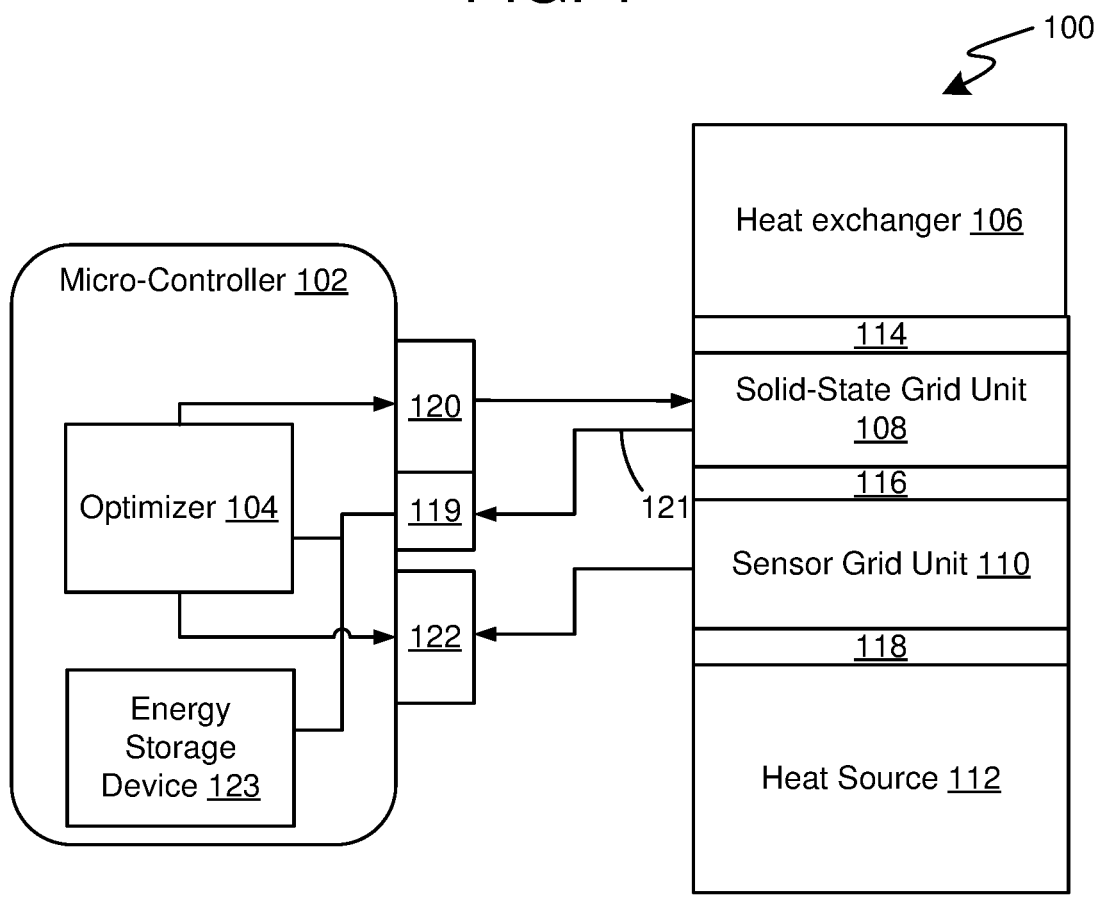
FIG. 2 illustrates a block diagram of a fine-grain dynamic solid-state cooling system in accordance with one embodiment.

FIG. 2 illustrates a block diagram of a fine-grain dynamic solid-state cooling system 100 in accordance with one embodiment. Cooling system 100 is designed around the principle of fine-grain temperature adjustment and feedback in order to solve the inefficiencies of solid-state-based cooling and provide unprecedented control over the spatial and temporal dynamics of systems where performance or functionality is highly sensitive to, or limited by temperature. For example, computer hardware, fan components, aircraft components, laser components, automotive components, and superconducting materials all require strict bounds on allowable temperatures to prevent failure. Additionally, cell growth within biological systems, activation energy and control of chemical reactions. Cooling system 100 includes a solid-state cooling grid unit 108, a sensor grid unit 110 and a micro-controller 102 having a high-capability optimizer 104. Each sensor sub-unit of sensor grid 110 is capable of independently sensing and dissipating heat from targeted K×K sub-regions of a 2D surface of a heat source, such as K×K sub-regions of a die and package surface or K×K sub-regions of a surface of hardware in a server (also referred to K×K sub-regions of a heat source 112). Because the solid-state cooling grid and sensor grid are tightly coupled, flexible and composable, all other heat source surfaces in a server, computer or portable device are also possible including motherboards, GPUs, CPUs, memory, chipsets, network interface cards, power modules and voltage regulator modules (VRMs). Additional exemplary heat source surfaces include batteries in vehicles, airplanes and portable devices, airplanes (navigation systems, nose cones, fuselage, engine/power plants, wings, landing gear, wheels, brakes, empennage), lasers (power supplies, pumps, optical cavities, laser media, mirrors), automotive (electronic control units (ECUs), embedded devices, tires, wheels, brakes, seats, wheels), fans (filter mesh, blades) and quantum computing (ion traps, Josephson junctions, superconducting circuits). Each K×K sub-region produces a heat flux which can vary relative to the sub-regions' neighboring positions. Optimizer 104 utilizes real-time sensor data sampled at a tunable interval to selectively target specific K×K sub-regions of the 2D surface of a heat source. It does so by automatically and dynamically adjusting power for each solid-state cooling sub-unit to meet one of several optimization criteria described in detail with reference to FIGS. 7-8 below.

Figure 3:
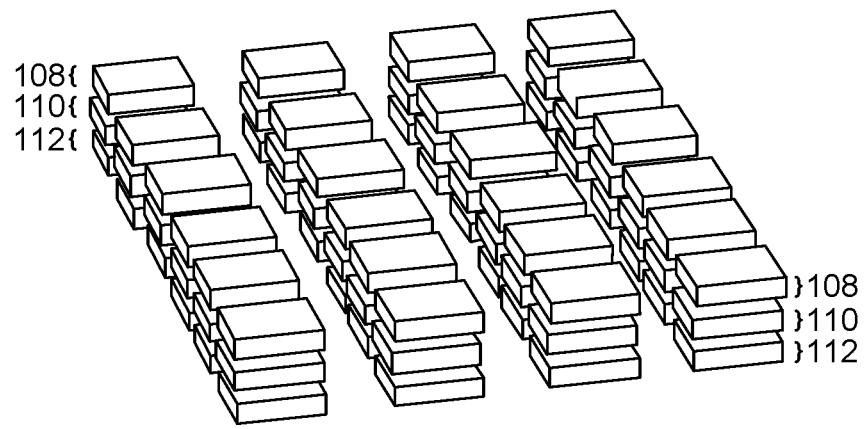
FIG. 3 is a three-dimensional diagram illustrating the main component layers of the cooling system of FIG. 1.

FIG. 3 illustrates the main component layers of cooling system 100 including solid-state cooling grid unit 108 constructed of small solid-state cooling sub-units, which sit directly above sensor grid unit 110 that is constructed of small sensor sub-units. Sensor sub-units of sensor grid 110 are in direct thermal contact with target sub-regions of heat source 112 and the cold reservoir via the bottom side of each sold state sub-unit of solid-state cooling grid 108. Solid-state cooling grid unit 108 is an N×N grid of solid-state cooling sub-units as shown in FIG. 3 where each sub-unit is independently powered with individual voltage and current streams. N×N solid-state grid 108 of solid-state cooling sub-units, which may be an N×N grid unit of thermoelectric cooers coolers (TECs), allow for granularity in the targeting of thermal sub-regions or sub-zones of a heat source 112 limited only by the size of each solid-state cooling sub-unit. The cold side of each N×N solid-state cooling sub-unit of solid-state cooling grid 108 is in direct contact with its corresponding M×M sub-units of sensor grid unit 110. The hot side of each solid-state cooling sub-unit is in direct thermal contact with a heat exchanger 106. Heat exchanger 106 will have sufficient power so as to meet the demands of dissipating the aggregate heat produced by active solid-state cooling sub-units in addition to the overall heat produced by the targeted heat sources 112. Heat exchanger 106, such as a heat sink and fan or radiator, is thermally connected to the hot side of N×N solid-state cooling grid 108. In FIG. 2 this may be done with non-conductive thermal paste 114. However, other ways of connecting the heat exchanger 106 to the hot side of solid-state cooling grid 108 is possible.

Solid-state cooling grid 108 may be manufactured by connecting existing solid-state cooling sub-units which are constructed of the proper dimensions. The size and number of each solid-state cooling sub-unit determines the resolution of the cooling system's cooling capability, while the resolution of sensor grid 110 (which is determined by the quantity of the sensor sub-units and their characterization) will determine the overall accuracy and therefore efficiency of cooling system 100. Many combinations of ratios between the number of sensor sub-units in sensor grid 110 relative to the number of solid-state cooling sub-units in solid-state cooling grid 108 are possible and have various applications.

Sensor grid unit 110 is an M×M grid of temperature sensor sub-units used in targeted dissipation. The M×M grid includes high thermal dissipation in a restricted set of dimensions (for example, the X, Y direction has a thermal transfer rate of 400 W/m ° C., but only 5 W/m ° C. in the Z direction). The material used in each sensor sub-unit of sensor grid 110 must have appropriate thermal characteristics or it can interfere with or hinder normal heat dissipation. In one embodiment, the material is Pyrolytic Carbon (PyC) or highly oriented pyrolytic graphite (HOPG) and serves two purposes, as a sensor and as a heat exchanger. PyC primarily acts as a replacement to the aluminum or copper based passive heat sink through its anisotropic heat transfer characteristics. An individual temperature sensor sub-unit includes a small cubic or rectangular element or block oriented along the a-b crystal plane such that the material transmits maximal heat along the axis of intended dissipation and away from heat source 112.

Figure 6:
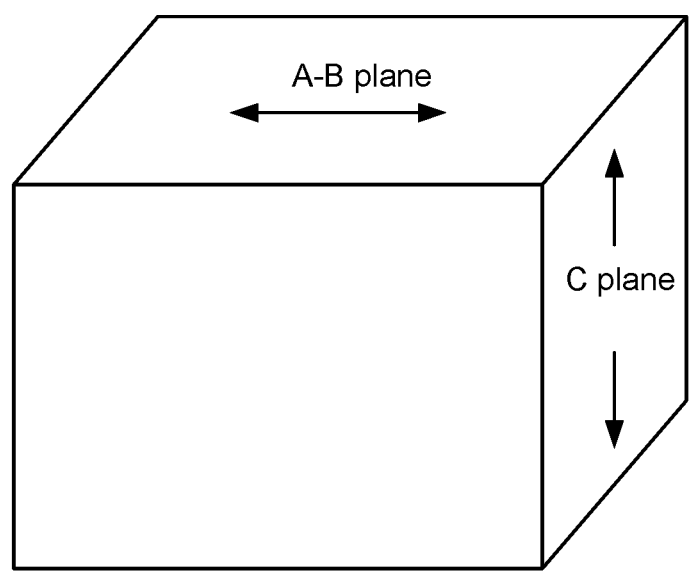
FIG. 6 is a diagram showing the various planes of a Pyrolytic crystal (PyC).

FIG. 6 is a diagram showing the various planes of a PyC crystal. PyC crystals are effected by the resistance to and heat transfer (thermal conductivity) in the various planes. For example, thermal expansion in the a-b plane may be $0.5 \times 10^{-6}$ cm/cm/° C., while the c plane is $6.5 \times 10^{-6}$ cm/cm/° C. Thermal conductivity in the a-b plane may be 400 Watts/meter ° C., while the c plane may be 3.5 Watts/meter ° C. Electrical resistance in the a-b plan may be 0.5 $10^{-3}$ ohm-cm, while the c plane may be 0.5 ohm-cm.

While PyC is a material that is commonly used in cooling applications, to manufacture a PyC or HOPG sensor sub-unit for sensor grid 110, the material is cut into strips sufficient to cover the surface areas of a solid-state cooler unit. The strips are arranged such that the a-b plane is oriented to be in thermal contact with the heat source on one side and a thermal reservoir or solid-state cooler cell is on the other side. The strips composing of a sensor unit may be arranged such that the dimension or volume of the unit is arbitrary. Two wires may be connected to a sub-unit of the raw material, then each sensor sub-unit is placed as close to the heat source as physically possible while also allowing for the sensor to transfer heat away from that point of contact and bring it directly to the cold reservoir created by the solid-state cooling sub-units of solid-state cooling grid 108 located above sensor grid 110.

Figure 4:
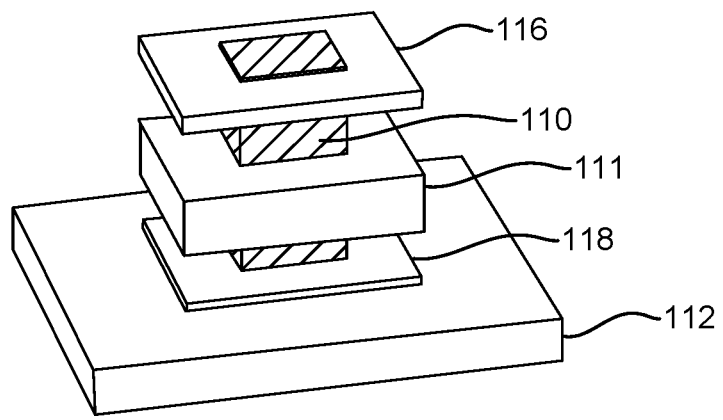
FIG. 4 is a three dimensional diagram illustrating the details of an individual temperature sensor sub-unit of a sensor grid and heat source of the cooling system of FIG. 1.

The details of an individual temperature sensor sub-unit of sensor grid 110 and heat source 112 are illustrated in FIG. 4. The bottom side of each sensor sub-unit of sensor grid 110 (which is surrounded at least partially by an insulator 111) is directly (or indirectly through a non-electrically-conducting thermal paste 118) connected to a target sub-region of heat source 112 while a top side of each sensor sub-unit of sensor grid 110 is directly (or indirectly through a non-electrically-conducting thermal paste 116) connected to a cold-side of its paired solid-state cooling sub-unit of solid-state cooling grid 108 that utilizes an optimization algorithm built upon a conceptual sensor grid 110 of sensor sub-units.

With reference back to FIG. 1, micro-controller 102 is a combined analog-to-digital (ADC) and digital-to-analog (DAC) converter that houses optimizer 104 and is responsible for control logic. Micro-controller 102 routes input data from sensor grid 110 to optimizer 104, applies a cooling algorithm and then outputs response voltages (or power signals) to appropriate individual solid-state cooling sub-units of solid-state cooling grid 108. Micro-controller 102 may also allow for dynamically changing the sampling and signaling rate, which can accumulate significant power consumption if not managed properly.

Optimizer 104 is an embedded and low-power device housed in micro-controller 102 and is responsible for taking input from sensor grid 110 and outputting voltages to solid-state cooling sub-units of solid-state cooling grid 108 in such a way as to optimize for driving specific solid-state cooling sub-units below a target temperature. In one embodiment, optimizer 104 is an ensemble of trained models. For example, optimizer 104 may be a trained neural network, a trained random forest, a trained genetic population, a trained reinforcement-learned agent, a trained gradient-boosted model, a trained particle swarm or a trained logistic model. Under one specific embodiment, optimizer 104 an embedded inference-phase neural network, operating at lowest possible numeric precision and power. The rate at which the neural network takes input examples from sensor grid 110 and thus outputs cooling signals to solid-state cooling grid 108 is a tunable parameter, limited by signaling rate, capability and power of micro-controller 102. Micro-controller 102 may allow for the neural network to adjust the sampling rate dynamically since it contributes to overall power consumption. The neural network architecture takes three inputs: 1) M×M sensor grid data that is routed through M×M sensor channels of input channel 122 to optimizer 104, 2) the total power cost over the sampling interval, and 3) the total power cost of optimizer 104 over the same interval. This allows optimizer 104 to differentiate between its own power costs relative to the power being dissipated. The neural network architecture maps the three inputs to two target outputs: 1) power signals (voltages) routed through N×N output channels of output channel 120 to solid-state cooling sub-units of solid-state cooling grid 108 and 2) the frequency with which to sample/signal at.

Figure 5:
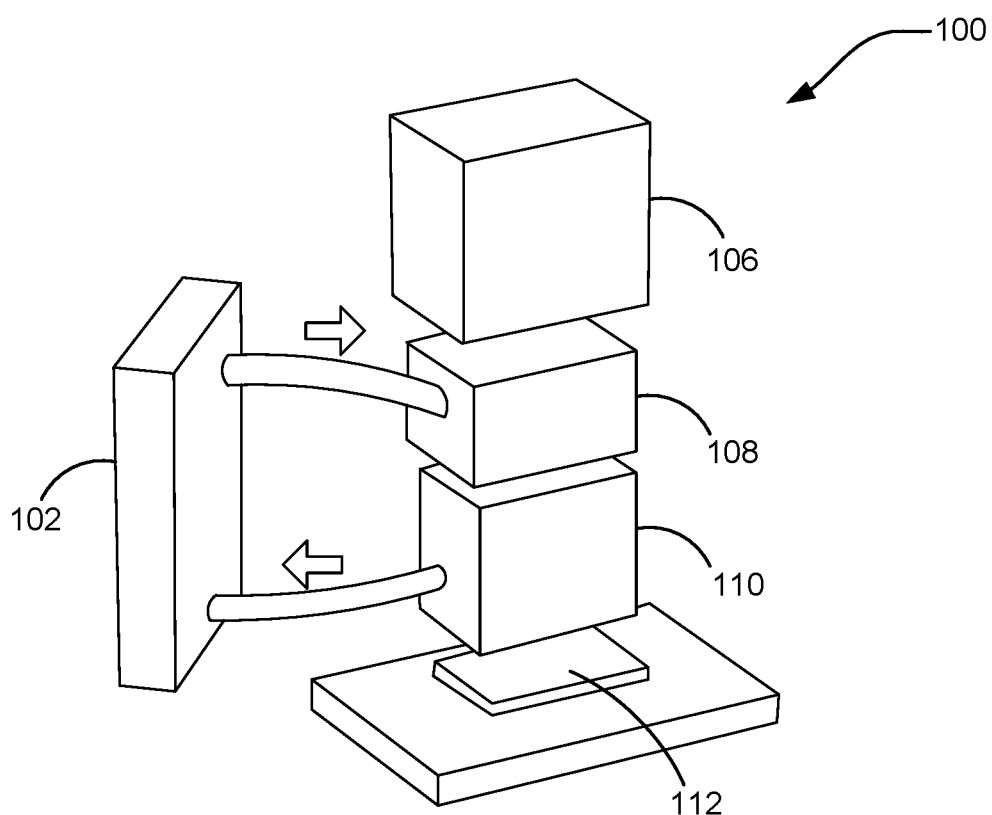
FIG. 5 illustrates a three-dimensional diagram of the cooling system of FIG. 1.

FIG. 5 illustrates a three-dimensional conceptual diagram of cooling system 100 showing how each component is organized (micro-controller 102 is not shown to scale for purposes of functional clarity). The orientation of micro-controller 100 may be free-floating or mounted to heat-sink and fan 106 in such a way as to not interfere with airflow across heat-sink or fan 106. The total power of micro-controller 100 and sensor grid 110 is intended to fall within limits of a typical 12V power draw. Solid-state cooling grid 108 may require additional power depending on the constraints imposed by resolution (i.e. the number of solid-state cooling sub-units) of the N×N grid.

As illustrated in FIG. 5, cooling system 100 includes solid-state cooling grid 108, which is constructed from an N×N set of small solid-state cooling sub-units. For example, each sub-unit may be approximately 2×2 mm$^2$ in area. Each sub-unit of solid-state cooling grid 108 is connected independently to a voltage supply, allowing for control of each individual solid-state cooling sub-unit in solid-state cooling grid 108 from a single micro-controller 102.

Solid-state cooling grid 108 is stacked directly on top of sensor grid 110. Sensor grid 110 is constructed from an N×N set of temperature sensors which also serve as heat-transfer elements, such that they do not interfere with normal heat flow from heat source 112 to the cold side of the solid-state cooling grid 108. In one embodiment, this can be accomplished by material choice of sensor grid 110 (i.e. using Pyrolytic Carbon to construct the sensor sub-units). In another embodiment, this can be accomplished by orienting traditional CMOS-based sensors between each solid-state cooling sub-unit and its target heat source within an insulator (electrically non-conductive) and two pieces of heat transfer material (e.g., aluminum or PyC) using thermal paste (shown as the top layer in each sub group in FIG. 3). In this embodiment, each of the N×N CMOS-based sensors would be sandwiched between the two heat-transfer elements which transfer heat away from the heat source 112 to the sensor 110, and then from the sensor 110 to the cold side of the solid-state cooling grid 108. An example of the layout of solid-state cooling grid 108, sensor grid 110 and sub-regions of heat source 112 is shown in FIG. 3.

The solid-state cooling and sensor grids 108 and 110 are stacked and then placed (with solid-state cooling grid 108 cold-side facing downward) on top of the target heat source 112, such as a chip, so that sensor grid 110 thermal paste 118 (FIGS. 1 and 4) is making direct contact with the surface of heat source or chip 112.

Heat exchanger 106 is placed on the top of solid-state cooling grid 108 to further dissipate the target heat from the heat source 112 in addition to whatever waste heat (to be minimized by optimizer 104) results from turning on/off solid-state cooling sub-units of the solid-state cooling grid 108. Another layer of PyC may be placed between the hot-side of solid-state cooling grid 108 and heat exchanger 106 to spread heat in the X-Y plane before it reaches heat exchanger 106 or heat exchanger may be made of PyC. The heat exchanger 106 may also be sub-divided into L×L channels of PyC or HOPG material by orienting sheets of the material with optimal heat-transfer characteristics along the X-Y plane into rolled up flexible tubes such that heat transfer can be routed directly from sub unit (i, j, l) of the top most sub unit into a specific channel. The goal is to provide channel-based passive cooling with the material choice, and utilize flexible cable-like or tube-like embodiments to route heat into specific environment locations or around heat-sensitive obstacles in a passive and adjustable way. Additionally, coating the heat exchanger 106 in Oxygen-Doped Carbon Nanotube coatings or related optimization treatments may be applied to boost conversion of heat energy into infrared radiation from the surface of the heat exchanger 106.

In operation and with reference back to FIG. 1, heat is produced at heat source 112 as a spatially non-uniform temperature distribution with dynamics which can vary in non-linear or even chaotic ways through time, such as the signatures produced by a chip or server component. The hottest points may be localized to various sub-regions or cells of a K×K grid across the heat source 112. Sensor grid 110 reports heat, on an M×M sub-unit level to micro-controller 102 through input channels 122. Micro-controller 102 then routes the thermal signature of sensor grid sub-unit locations to optimizer 104. Optimizer 104 predicts a sequence of cooling and charging cycles to apply to the heat source 112 which meet various optimization criteria. These optimization criteria are used to predict when and where to make adjustments to the power or cooling cycle time which gets applied to individual solid-state cooling sub-units of solid-state cooling grid 108 in order to target the cooling of specific sub-regions or cells of heat source 112, or to predict the set of solid-state cooling sub units to recover waste energy from by making adjustments to the charging cycle time for each unit, and at what point over an arbitrary time interval such cycles begin execution. Optimizer 104 specifies from which sub units of solid-state cooling grid 108 to route recovered power from via feedback channel 121, and how long each resulting source should be used to charge an energy storage device 123 by opening and closing storage channel or switch 119 at appropriate steps. Optimizer 104 uses non-linear functions to approximate the task of assigning arbitrary time intervals over which cooling and charging cycles are applied, and to which sub units they should be applied to. This non-linear capability in both spatial and temporal dimensions makes optimizer 104 capable of unprecedented control over electromagnetic, kinetic and chemical dynamics at the surface of heat source 112, even in non-linear and degenerate systems, which opens up a wide spectrum of applications.

For example, all available power may be dedicated to only the most relevant solid-state cooling sub-units of solid-state cooling grid 108, and only above a single hot spot. When many grids of optimizer-controlled solid-state cooling units are stacked, optimizer 104 can apply maximum power to each layer in dynamic time-varied intervals which maximizes thermal capacity and heat flow rate, while simultaneously routing and distributing the heat as it moves to the environment so as to maximize the amount of energy recovered over a given interval. Optimizer 104 decides from which sub-units to route recovered power from via feedback channel 121, and how long each source should be used to charge an energy storage device 123 by opening and closing storage channel 119 at appropriate steps. The cooling and charging cycles are allowed to complete, and then the next iteration begins. This particular embodiment provides a means to achieve localized, targeted cooling of sub-regions or cells of heat source 112 to operate well below ambient temperatures, which drives the average surface temperature down effectively cooling the entire heat source 112, and simultaneously recovering waste heat to improve efficiency in mobile or power-constrained environments, or passively charge dense energy storage systems where surfaces are exposed to large temperature differentials, such as those found in hypersonic vehicle applications or high-performance computing systems.

Optimizer 104 sees the entire volume of temperatures at any given time t as sampled from the $l^{th}$ sensor grid's $i^{th}$ row and $j^{th}$ column. The total number of sensor sub-units sampled is M. Likewise, the total number of solid-state cooling sub-units is defined as N=ijl. The simplest configurations set N=M, such that the sensor sub unit (i, j, l) corresponds directly to the solid-state cooling unit above it, but this isn't required in principle. There are some applications where N≠M, which sacrifices granularity of either the sensor grid or cooler grid dimension, making unmatched sub-units function as groups but with the added benefit of improved efficiency and cost.

Optimizer 104 is configured to guide the application of Fine-Grain Cooling Cycles (FCC) and Fine-Grain Storage Cycles (FSCs) across Khot spots and G=N−K passive spots, which are both selected from among M total sub-regions of a heat source. Optimizer 104 applies FCC such that a fixed energy budget $E_{cool}$ is maintained over the total cooling cycle time $t_{cool}$ while decreasing the average temperature across Khot spots. The time for a given cycle to execute across K hot spots within the set of all cooling meshes is the sum of time it takes to execute each $k^{th}$ cycle:

$$t_{cool} = \sum_{k}^{K} t_k$$

Likewise, the total energy required to execute a single FCC across K hot spots within a set of all cooling meshes is given by summing over the power applied at each solid-state cooling sub unit (i, j, l):

$$E_{cool} = \sum_{k}^{K} p_k t_k$$

$$P_{cool} = \sum_{k}^{K} p_k$$

The sampling frequency $f_{sample}$ determines how often optimizer 104 makes observations by sampling from the sensor grid. The action-opportunity frequency $f_{action}$ constrains how often optimizer 104 can execute the K FCCs and/or G FSCs across the solid-state cooling grid. The sampling frequency of the sensor grid is not coupled to $f_{action}$ such that cooling and charging cycle times can be executed independently from the rate of sampling. In all embodiments, optimizer 104 is free to make observations from the sensor grids more often than applying cooling or charging cycles.

Some solid-state cooling solutions utilize thermo-electric effects to achieve a temperature differential between two surfaces, such as Thermo-Electric Coolers (TECs) or Thermionic Converters (TCs). These devices can also be run in reverse to generate power from temperature differentials across the two surfaces. Optimizer 104 can select from the subset G of the N solid-state cooling sub units to draw power from over an interval $t_{charge}$ in order to charge a high-capacitance component or energy storage device such as a battery, supercapacitor, or ultracapacitor:

$$t_{charge} = \sum_{g}^{G} t_g$$

The charging cycle time for each solid-state cooler is $t_g$, and can be tuned by optimizer 104 to efficiently recover wasted heat or potential energy from the temperature difference between hot and cold sides of a solid-state cooling sub unit (i, j, 1). The amount of time charging from the G sub-units (i, j, 1) does not need to be evenly distributed across the total charge cycle time $t_{charge}$, and in some embodiments optimizer 104 is allowed to tune this parameter.

Configurations which execute FSCs benefit from sensor sub-units both above and below each solid-state cooling sub-unit because optimizer 104 can calculate directly the potential energy gains before executing a charging cycle. In the case where multiple solid-state cooling grids are stacked vertically, optimizer 104 can potentially decide to create large temperature differential across a particular solid-state cooling sub unit (i, j, 1) by allowing the temperature of the hot spot at (i, j, 1−1) to increase while simultaneously executing cooling cycles on the solid-state cooling sub-unit (i, j, 1+1). The energy available to be stored from the set of Gunpowered solid-state cooler sub-units is $E_{charge}$, and is proportional to the temperature difference between the two sides of sub unit g at (i, j, 1) and the time over which the temperature differential $\Delta T_g$ is maintained:

$$E_{charge} \propto \sum_{g}^{G} \Delta T_g t_g$$

Having sensor grids above and below a solid-state cooling grid makes it possible to calculate the temperature gradient numerically each step. In the case where the material properties for Seeback Coefficient $\beta$ and the local conductivity $\sigma$ are known, the energy and power can be solved for directly using only input from the sensor grids and the previous step of charging cycle times if they are allowed to vary:

$$E_{charge} = \sum_{g}^{G} \sigma \beta (\nabla T_g t_g)$$

$$P_{charge} \frac{\partial}{\partial t}(E_{charge}) = \sum_{g}^{G} \sigma \beta \frac{\partial}{\partial t}(\nabla T_g t_g)$$

Feeding this information to optimizer 104 improves its ability to predict how much power can be gained over an interval $t_{charge}$ from the heat source. Likewise, it also enables optimizer 104 to predict what step S to issue cooling cycles, where, and by what intensity such that various optimization criteria are met. Several possible embodiments of optimizer 104 are described above.

Figure 7:
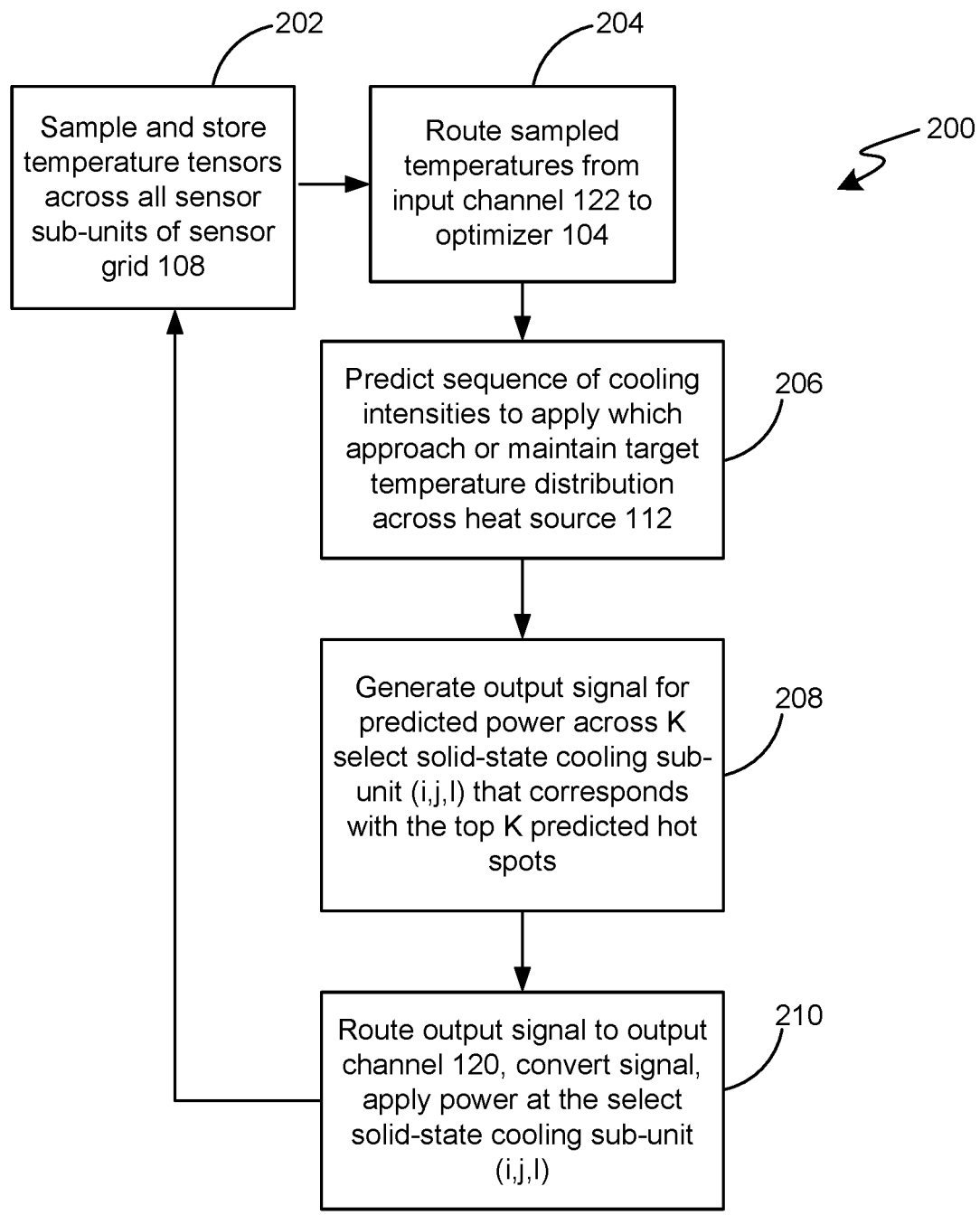
FIG. 7 illustrates a method of cooling a heat source under one optimization embodiment.

FIG. 7 illustrates a method 200 of cooling heat source 112 under one optimization embodiment. At block 202, micro-controller 102 samples and stores temperatures across all sensor sub-units of sensor grid 110. At block 204, micro-controller 102 routes sampled temperatures from input channel 122 to optimizer 104. Optimizer 104 is tasked with driving the distribution of temperatures as sampled from the set of sensor sub units (i, j, 1) toward some fixed reference distribution $F^l_{i,j}$. The input to the model is the tensor of temperatures $T^l_{i,j}$ at step S=0 as defined by the stack of sensor grids. An arbitrary number of historical temperatures $T^l_{i,j}$ from previous steps can be input along with the current temperature tensor. The output of the model is a tensor of applied cooling intensities $C^l_{i,j}$ which is defined by the power $p_k$ applied to each solid-state cooling sub unit (i, j, 1) over an arbitrary number of steps, S=1,2,3, . . . $S_{max}$, where $S_{max}$ is a discretized piecewise linear function of $t_{cool}$, K and $f_{action}$. Optimizer 104 predicts a magnitude of the cooling intensity signals and aims to drive the entire system toward the target distribution $F^l_{i,j}$ within a fixed sequence of steps $S_{max}$. At block 208, optimizer 104 generates an output signal corresponding to power required to cool solid-state cooling sub-unit (i,j, 1) of grid 108 to the target temperature distribution. At block 210, the output signal is routed to output channel 120 and the output signal is converted to power the corresponding solid-state cooling sub-unit (i,j, 1) of grid 108. The method 200 returns to block 202 and temperatures are sampled and stored again at block 202.

Optimizer 104 in FIGS. 2 and 5 is free to make observations from sensor grids 110 more often than applying cooling cycles. Optimizer 104 predicts the step S at which it issues cooling cycles via the cooling intensity tensor $C^l_{i,j}$. Optimizer 104 is free to predict the cooling intensity tensor $C^l_{i,j}$ by varying both the solid-state cooling sub unit's power $p_k$ at (i, j, 1) and the sub unit's cooling cycle time $t_k$.

Figure 8:
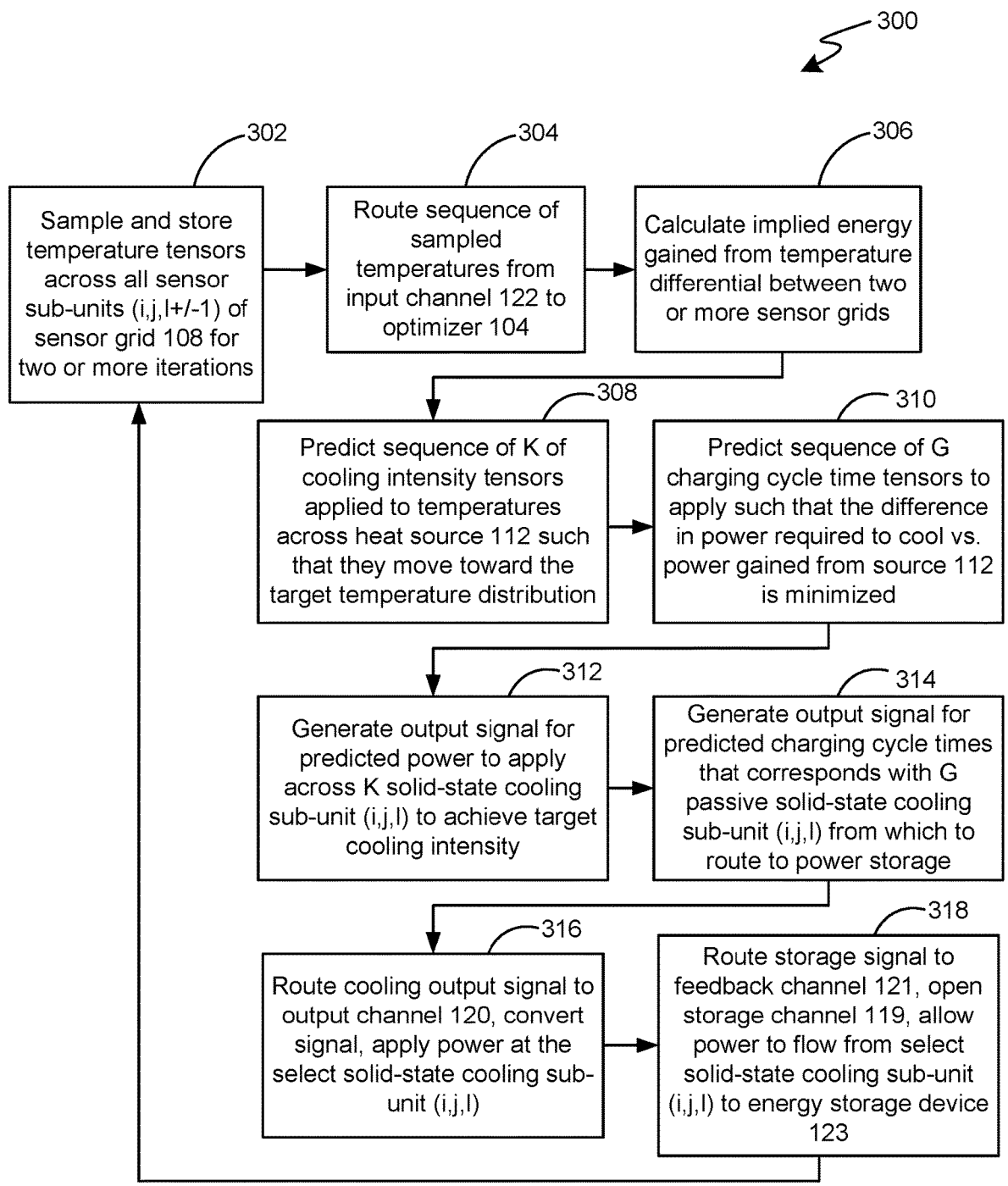
FIG. 8 illustrates a method of cooling a heat source under another optimization embodiment.

FIG. 8 illustrates a method 300 of cooling heat source 112 under another optimization embodiment called a cool-charge mode. At block 302, micro-controller 102 samples temperatures across all sensor sub-units of sensor grid 110. At block 304, micro-controller 102 routes sampled temperatures from input channel 122 to optimizer 104. At block 306, implied energy gained from the temperature differential, and implied heat transfer velocity at current temperatures for the heatsink-sensor material, such as PyC or HOPG used to construct sensor grid 108, is calculated and routed to optimizer 104. The input to the model is the last sampled tensor of temperatures $T^l_{i,j}$ at step S=0 as defined by the stack of sensor grids, along with an arbitrary number of other scalar input values such as the implied recovery energy gained at the last sample, or the implied heat transfer rate of the heatsink-sensor material properties at the current temperature and step, or the power used to power the grids, the optimizer itself, or both from the previous. An arbitrary number of historical $T^l_{i,j}$ from previous steps S=−1, −2, . . . etc, and likewise for the scalar energy required over the same interval. At blocks 308 and 310, optimizer 104 uses these two or more input tensors to predict the ideal sequence of cooling intensities and execution time for a subset K of solid-state cooling sub-units over an interval $t_{cool}$ along with the ideal sequence of charging cycle times over which to charge a high-capacitance component such as a battery, supercapacitor, or ultracapacitor which may be attached to micro-controller 102 over an interval $t_{charge}$ by selectively varying $t_g$ among the G passive solid-state cooling subunits. The intervals are optimized in such a way that minimizes the average temperature of the target heat source and simultaneously maximizes the average waste heat converted into stored power. At blocks 312 and 314, the first output of the model as a tensor of applied cooling intensities $C^l_{i,j}$ over K hot spots and the second output tensor $Q^l_{i,j}$ of applied charging cycle times over G passive solid-state cooling sub units at (i, j, 1) are converted to their appropriate signals by micro-controller 102. The cooling intensity tensor $C^l_{i,j}$ is defined by the power $p_k$ applied to each solid-state cooling sub unit (i, j, 1) over an arbitrary number of steps, S= 1, 2, 3, . . . $S_{max}$, where $S_{max}$ is a discretized piecewise linear function of $t_{cool}$. The tensor of applied charging cycle times $Q^l_{i,j}$ is predicted as distribution of charging cycle times $t_g$ over $t_{charge}$ applied to each of the G solid-state cooling sub units (i, j, 1) over an arbitrary number of steps, S= 1, 2, 3, . . . $S_{max}$. Optimizer 104 can thus balance power lost to cooling with the power stored through passive charging of an energy storage device by minimizing the difference between power required to cool $P_{cool}$ and power gained from harvesting waste energy $P_{charge}$, and be trained to simultaneously maintain or approach the target temperature distribution $F^l_{i,j}$. At blocks 312 and 314, optimizer 104 generates an output signal corresponding to power required to cool solid-state cooling sub unit (i, j, l) of grid 108 the target temperature distribution and a second output signal corresponding to the charging cycle times needed to balance the energy cost of cooling with the energy stored. At block 316, the output signal is routed to output channel 120 and the output signal is converted to power the corresponding solid-state cooling sub-unit (i, j, l) of grid 108. At block 318, the feedback channel 121 routes power from the predicted G solid-state cooling sub-units (i, j, l) and allows power from each to flow to energy storage device 123 by opening and closing storage channel 119 for the predicted intervals. The cooling and charging cycles are allowed to complete, and the next iteration then begins. The method 300 returns to block 302 and temperatures are sampled again at block 302.

Optimizer 104 is free to make observations from the sensor grids more often than applying cooling cycles. Optimizer 104 predicts the step S at which it issues cooling cycles via the cooling intensity tensor $C^l_{i,j}$. Optimizer 104 predicts the step S at which to begin charging cycles via tensor of applied charging cycle times $Q^l_{i,j}$. Optimizer 104 is free to predict the cooling intensity tensor $C^l_{i,j}$ by varying both the solid-state cooling sub unit's power $p_k$ at (i, j, l) and the sub unit's cooling cycle time $t_k$ for all hot spots K. Optimizer 104 is free to predict the tensor of applied charging cycle times $Q^l_{i,j}$ by selecting which of G solid-state cooling sub units (i, j, l) and the sub unit's cycle time $t_k$.

Figure 9:
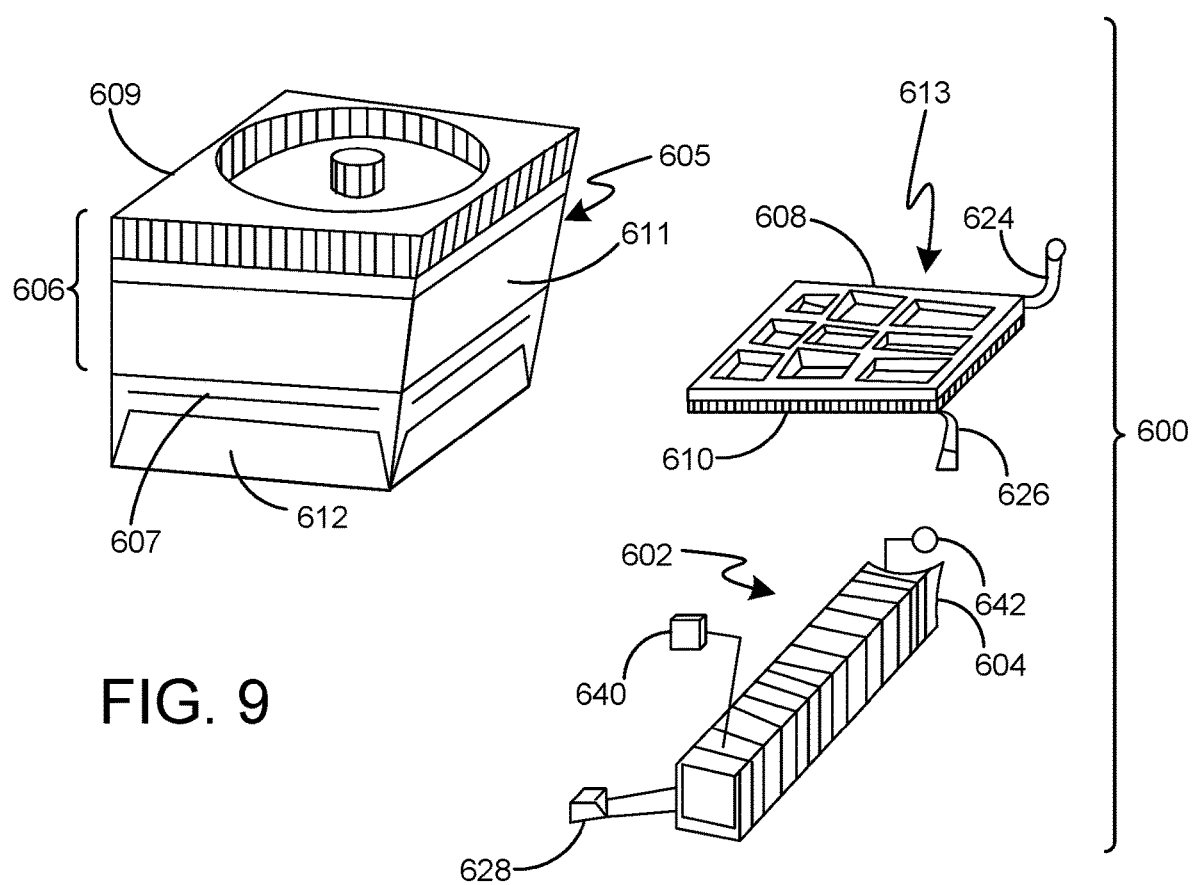
FIG. 9 illustrates a fine-grain dynamic solid-state cooling system in accordance with another embodiment.
Figure 11:
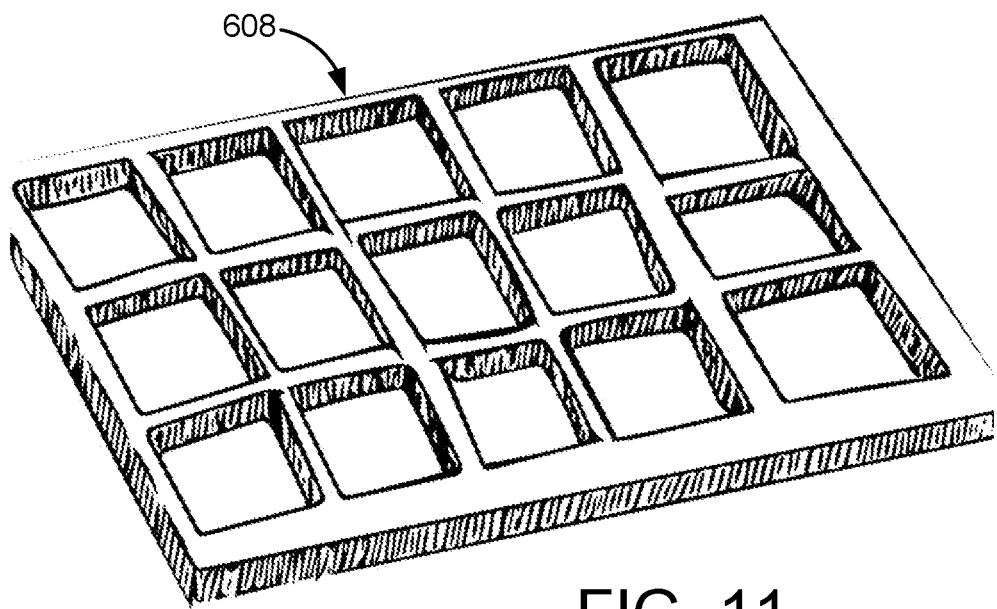
FIG. 11 illustrates a perspective view of a cooler mesh according to an embodiment.

FIG. 9 illustrates a fine-grain dynamic solid-state cooling system 600 in accordance with another embodiment. Cooling system 600 includes an integrated component including: a heat exchanger module 605 that includes a heat exchanger 60_6 and at least one mesh housing 607. In one embodiment and as illustrated in FIG. 11, heat exchanger 606 includes a fan or radiator cables 609 attached to a radiator 611. Radiator cables are passive and adjustable cable or wiring that direct transfer of thermal energy away from topmost mesh elements to distant location in the environment. Radiator cables or a radiator may be constructed from or coated in material produced through up-shifting of carbon-nanotubes (CNTs) or the coating of or embedding of treated CNTs. Heat exchanger module 605 may include a set of adjustable fasteners that bind radiator 611 to mesh housing 607. Other heat exchanger solutions could replace radiator 611 and fan or radiator cables 609, such as various forms of liquid or evaporative cooling fluids. Mesh housing 607 is configured to receive an adaptive mesh module 613 and may be expandable to connect to other mesh housings and maintains thermal contact between meshes within the housing. Mesh housing 607 also provides thermal contact between a bottommost mesh and target heat source 612 as well as thermal contact between a topmost mesh and radiators 611. In other words, the at least one mesh housing 607 provides a source of connectivity for multiple or single optimizers 604 to use as a means to achieve routing of heat transfers between layers, routing of heat transfers to environment, cooling of particular locations within target heat source 612, storing and releasing of waste-heat energy from capacitors, ultra-capacitors, supercapacitors or batteries.

Adaptive mesh module 613 includes at least one flexible solid-state cooling mesh (or cooler mesh) 608 and at least one flexible sensor mesh (or sensor mesh) 610. Mesh housing 607 may be made of the same material as solid-state cooling mesh 608 and sensor mesh 610, but with added guiding rails to help place the target meshes in thermal contact with their respective surfaces. Because mesh housing is flexible, variable numbers of meshes can be added within the limits of the hosing material's expandability. Mesh housing 607 can then be compressed and tightened to firmly hold the meshes together, and keep the top of mesh housing 607 in direct thermal contact with heat exchanger module 605. Solid-state cooling mesh 608 further includes a power and signal connector 624 and sensor mesh 610 further includes a power and signal connector 626.

One or more solid-state cooling meshes 608 and one or more sensor meshes 610 are stacked or connected to form an adaptive mesh module 613. Adaptive mesh module 613 may include larger meshes formed from smaller ones. Stacking multiple cooler meshes 608 allows for improved cooling capability, while composing many meshes allows for expanding a single mesh's surface area. Adaptive mesh module 613 may also include arbitrary numbers of flexible grids which are composed of variable numbers of sensor or cooler meshes. Cooler meshes are composed of sub-units which are considered to be solid-state and electrically powered. A mesh is composed of a grid of cells, which hold either cooler units or sensor units. The grids can be arbitrary dimensioned, square or rectangular, and should be composable and stackable. The number of cells in connected mesh layers do not need to match in order to function. The ordering of meshes in the stack is also arbitrary. This design assumes the sensor grid is in thermal contact with a heat source 612 such that it transfers heat between the heat source and cooler mesh above it. However, it is possible that other implementations where additional sensor mesh layers are added between cooler mesh layers, or are placed at the top of the unit between the topmost cooler mesh and radiator 611.

Figure 10:
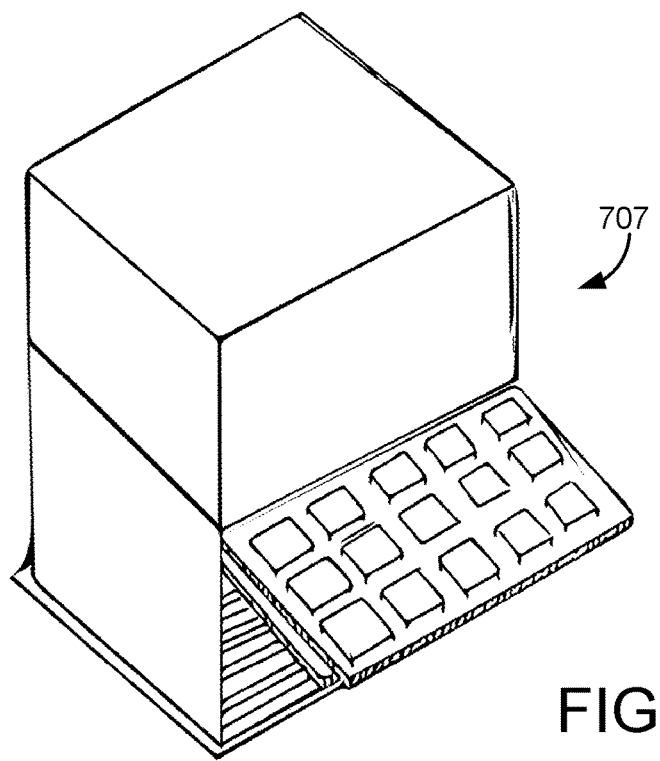
FIG. 10 illustrates a perspective view of an embodiment of an adaptive mesh module.

FIG. 10 illustrates a perspective view of another embodiment of an adaptive mesh module 707 configured to receive many cooler meshes and many sensor meshes as is shown.

Figure 12:
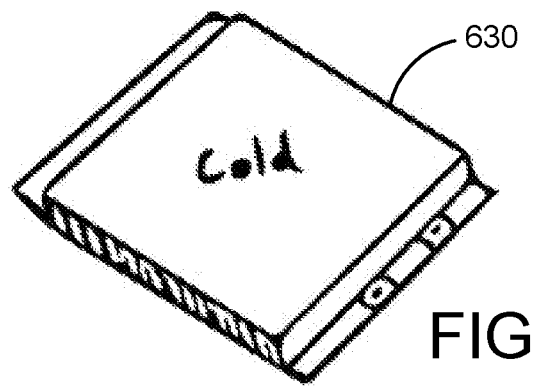
FIG. 12 illustrates an embodiment of a single cooler sub-unit or cell with the cold side oriented upwards.
Figure 13:
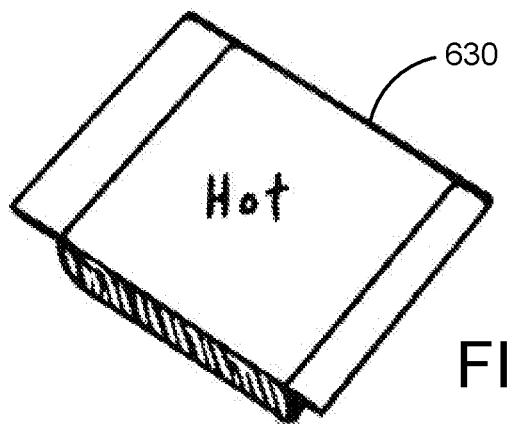
FIG. 13 illustrates an embodiment of a single cooler sub-unit or cell with the hot side oriented upwards.

FIG. 11 illustrates a perspective view of a cooler mesh 608. Cooler mesh 608 is a flexible set of cooling cells (e.g., cells composed of solid-state cooling sub-units like TECs) each routed with individual voltage and current wiring streams from a controller 602. Cooling mesh 608 allows for granularity in the targeting of thermal zones limited only by the size of the cooling cells (for example, TEC units). FIG. 12 illustrates a single cooler sub-unit or cell 630 (for example, TEC unit) with the cold side oriented upwards. FIG. 13 illustrates single cooler sub-unit or cell 630 with the hot side oriented upwards. The cold side of each cooler unit is in direct thermal contact with its corresponding sensor cell in an attached sensor mesh 610, or stacked atop another cooling mesh 608 to dissipate heat from the hot-side of its partnered cooling cell below. Cooler units (e.g., a standard TEC unit) are fitted into a flexible frame, such as cooler mesh 608 illustrated in FIG. 11, which defines each cooler cell. The cell frame is used to hold the cooler unit as a cooler mesh 608.

Figure 14:
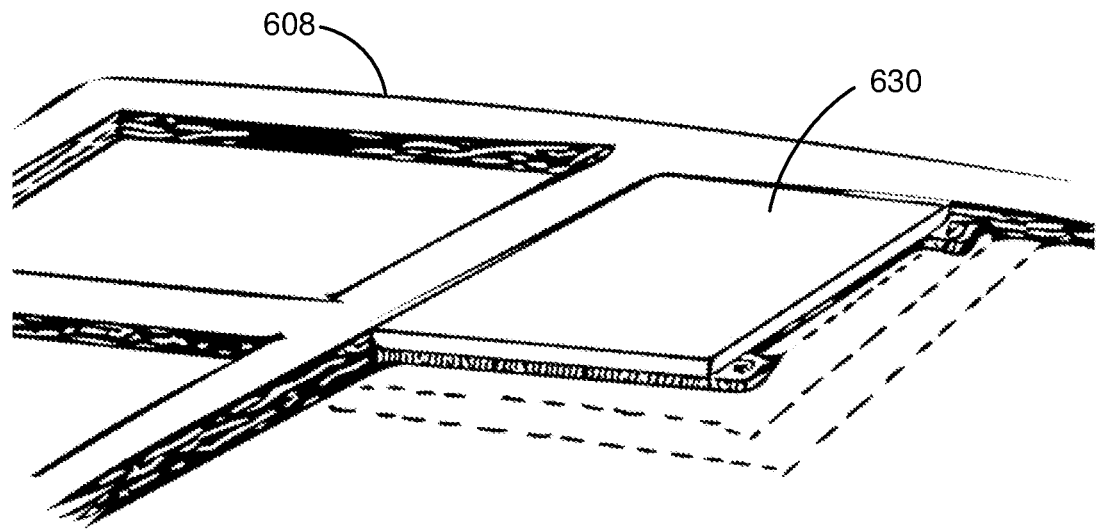
FIG. 14 illustrates a perspective view of an embodiment of a cooler sub-unit being inserted into a mesh to form a cooler mesh.

FIG. 14 illustrates a perspective view of a cooler sub-unit 630 being inserted into a mesh to form a cooler mesh 608. Each cooler sub-unit or cell 630 is defined as an electrically powered unit which gets cooler on one side and hotter on the other. The cooler sub-unit or cell 630 meets the following criteria: allows an individual cooler unit 630 to connect to a flexible mesh 608 and receive location-specific variable power signals at arbitrary intervals; securely snaps into the cooler mesh 608; provides compatible power connectors to the cooler sub-unit 630; and dependably connects relevant wiring from the cooler mesh 608 to the individual cooling sub-unit 630.

Figure 15:
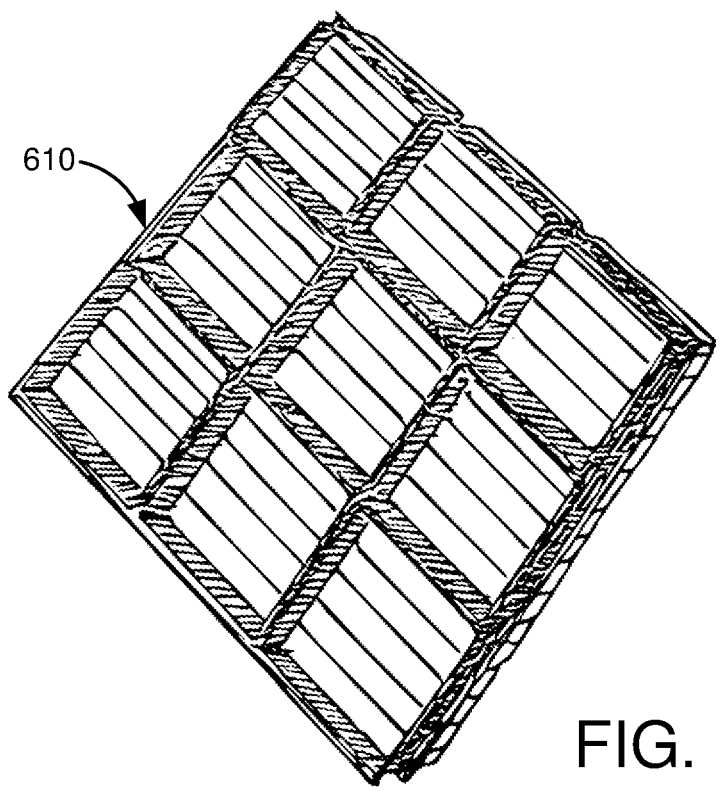
FIG. 15 illustrates a perspective view of an embodiment of a sensor mesh.

A FIG. 15 illustrates a perspective view of a sensor mesh 610. Sensor mesh 610 is a flexible grid of sensor sub-units or cells which place the sensor sub-unit material contained within each sub-unit or cell in direct thermal contact with heat source 612 on the bottom side, and in direct thermal contact with a thermal reservoir or cooler sub-unit or cell 630 on the other side, such that heat flows from the bottom to the top of sensor mesh 610. Sensor mesh 610 is flexible and is able to withstand temperatures below the freezing point of water and above the maximum temperature of the cooler sub-units 630 or heat source 612. Each sensor cell simultaneously transfers heat upward to the cooler sub-unit or cell 630 with which it is paired, and also provides feedback to optimizer 604 on the current state of the target heat source at the particular cell's location in space. The capability of the sensor to transfer heat (doing so faster than possible with traditional materials) in addition to acting as a sensor is of critical importance. The material used as a sensor unit has appropriate thermal characteristics or it can hinder normal heat dissipation. In this case, the material serves two purposes, as a sensor and as a heat sink. It primarily acts as a replacement to the aluminum or copper based passive heat-sinks used in cooling applications. One such implementation is realized through Pyrolytic Carbon (PyC) or Highly-Oriented Pyrolytic Graphite (HPOG) as described above. In general, the sensor unit is a small cubic or rectangular block of a material.

Figure 16:
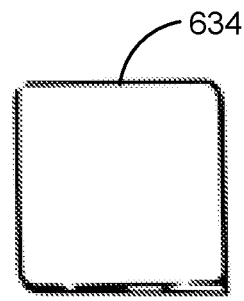
FIGS. 16-20 illustrate an embodiment of the construction of a sensor sub-unit or cell.
Figure 17:
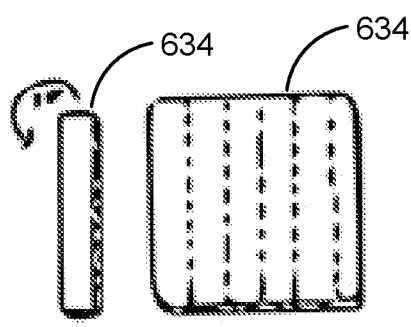
Figure 18:
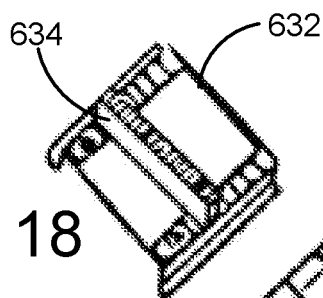
Figure 19:
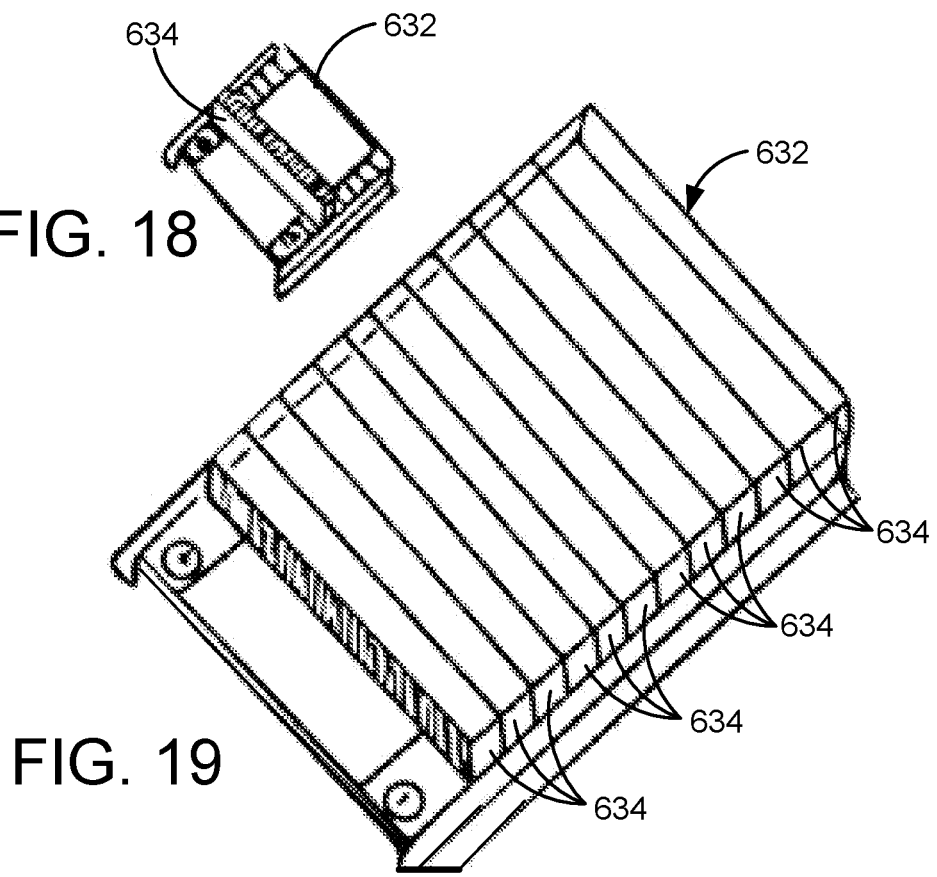
Figure 20:
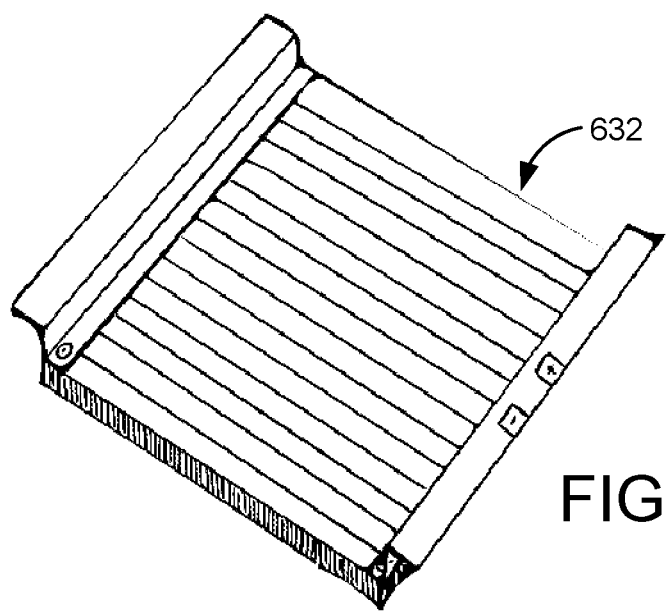

FIGS. 16-20 illustrate the construction of a sensor sub-unit or cell 632. In FIGS. 16 and 17 PyC or HPOG material 634 is cut into rectangles so that the plane of maximal heat transfer of material 634 is exposed and then each rectangle is oriented on a sensor sub-unit as illustrated in FIG. 18 and adjacent to each other to form sensor sub-unit or cell 632 in FIGS. 19 and 20, where FIG. 19 illustrates a bottom sensor sub-unit or cell 632 and FIG. 20 illustrates a top of sensor sub-unit or cell 632. In general, each sensor sub-unit is a plurality of small cubic or rectangular blocks of material 634 with anisotropic heat transfer properties oriented along the plane of maximal heat transfer rate (e.g. PyC or HPOG oriented with the z-axis parallel to the a-b crystal plane as shown in FIG. 6), such that it transmits maximal heat along the axis of intended dissipation, away from the target heat source, and guides heat into the thermal reservoir provided by the cold side of the Cooling-Cell coupled to it.

Figure 21:
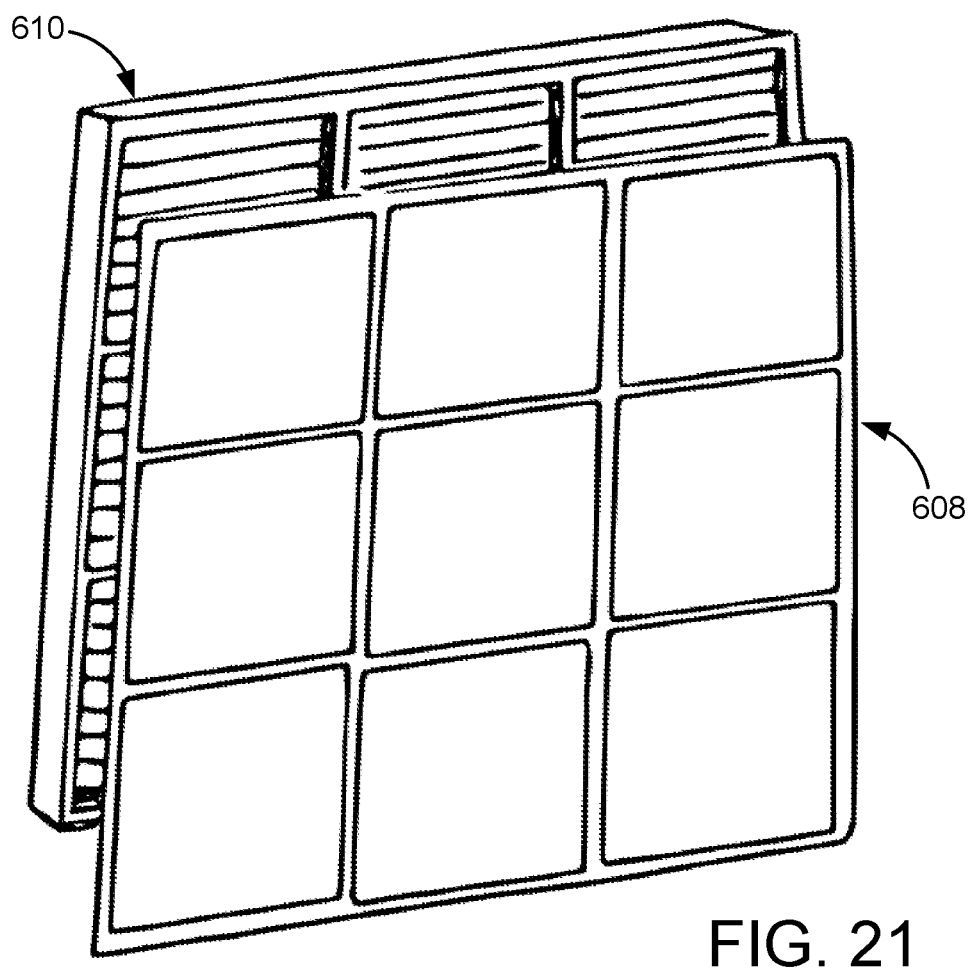
FIG. 21 illustrates an embodiment of the connecting together of or snapping together of a cooler mesh with sensor mesh.

The bottom side of each sensor sub-unit or cell 632 is connected directly (or indirectly) to a target region of the heat source, while the top side of each sensor sub-unit or cell 632 is directly (or indirectly) connected the cold-side of its paired solid-state cooling sub-unit 630. Sensor sub-units or cells 632 are composed of a sensor unit, and a cell frame. The sensor cell meets the following criteria: allows an individual sensor unit to connect to a flexible mesh and be probed at arbitrary intervals such that location-specific signals can be queried; utilizes sensors composed of materials (such as Highly-Oriented Pyrolytic Graphite (HOPG) Sensor Units) which simultaneously transfer heat in thermal contact with the bottom of the unit to the top of the unit; allows heat to transfer to one or more partner-cells in thermal contact with the top of the unit; provides thermodynamic feedback about the environment state near the target heat source in the form of pressure, volume, temperature or velocities through voltage, current or resistance changes of the material; provides compatible power connectors to the sensor unit; and dependably connects relevant wiring from the sensor mesh to the individual sensor unit. FIG. 21 illustrates the connecting together of or snapping together of cooler mesh 608 with sensor mesh 610.

With reference back to FIG. 19, controller unit 602 is defined as a combined set of components for driving power to the cooler cells 630, routing input signals from sensor meshes 610 via an analog-to-digital converter (ADC) to optimizer 604, and from optimizer 604 to the cooler cells 630 via a digital-to-analog (DAC) converter. Optimizer 604 is an embedded device in controller 602 as shown in FIG. 2 and is responsible for making control logic decisions. The drivers and I/O modules should be expandable to allow growing mesh sizes and finer-granularity meshes. Controller unit 602 should also allow for dynamically changing the sampling and signaling rate independently, since these can accumulate significant power consumption if not managed properly. Optimizer 204 can also manage these rates as needed for certain optimization strategies.

The orientation of controller unit 602 is arbitrary and can be free-floating or mounted to radiator 611 and mesh housing 607 in such a way as to not interfere with airflow across the heat exchanger 606. The total power consumed by controller 602 is determined by the characteristics and number of cooler units 630, sensor units 632, in addition to optimizer 204 and heat exchanger power requirements.

Driver 628 is defined as an expandable and modular set of cooler cell current drivers and I/O subsystems. The number of I/O subsystems is determined by how many cooler and sensor cells are present in each mesh. Likewise, the number of driver subsystems is scaled with the number of cooler cells such that there is sufficient power to each individual cell to operate at its intended cooling capabilities. Power and output signal connector is represented by 630 and power and input signal connector is represented by 632.

Optimizer 604 is defined as an embedded and low-power analog device located within controller unit 602. It is responsible for taking input from the sensor mesh 610 and outputting voltages to cells within the cooler mesh 608 in such a way as to optimize for driving specific locations on the surface area of target heat source 612 below a target temperature. Optimizer logic is completely specified by a trained model or models, for example, by a pre-trained, inference-phase neural network, operating at lowest possible numeric precision and power. The neural network can be updated from software, or customized neural networks can be re-trained to allow for custom cooling strategies using an open-source software stack. The rate at which the neural network takes input examples from sensor mesh 610 and thus outputs cooling signals to cooler mesh 608 is a tunable parameter, limited by the signaling rate, capability and power of controller 602. If the Micro-controller, which implements Controller 602, allows for it, the neural network can adjust the sampling rate of both the input and output signals dynamically. The neural network architecture takes 4 inputs: the values at each position in sensor mesh 610; the total power cost over the sampling interval; and the total power cost of the device over the same interval. This allows the device to differentiate between its own power costs relative to the power being dissipated. The neural network architecture maps these three inputs to three target outputs: the power of each individual cooler cell 632 in the cooling mesh 608 in terms of voltage and/or current; the frequency with which to sample at; and the frequency with which to signal at. By switching into power-storage mode, it can apply the same optimization criteria above to the storage of waste energy (turning TEC heat differentials into voltage and current signals), to store to super-capacitor or similar technology, which can be utilized quickly on future cooling cycles or stored for long-term use later on when the device is powered on again without a dependable power supply or when the server is in off state. This allows for optimizer 604 to start the system before power is applied to the host processor or other device, making it possible to initialize power modules, CPUs, GPUs, Memory and Chipset features at a critical temperature and sustain from these initial conditions a low temperature operation.

Although the present invention has been described with reference to preferred embodiments, workers skilled in the art will recognize that changes may be made in form and detail without departing from the spirit and scope of the invention.

What is claimed is:

1. A cooling system comprising:
    a plurality of sensor sub-units arranged in a grid and configured to be thermally connected to a heat source, the heat source having a plurality of sub-regions that correspond with the plurality of sensor sub-units;
    a plurality of solid-state cooling sub-units arranged in a grid, each solid-state cooling sub-unit including a cold side and a hot side and each solid-state cooling sub-unit corresponding with one of the plurality of sensor sub-units, wherein the cold side of each solid-state cooling sub-unit thermally connects to one of the sensor sub-units and is configured to dissipate heat from the sub-regions of the heat source; and
    a heat exchanger thermally connected to the hot side of each of the solid-state cooling sub-units and configured to dissipate additional heat from the sub-regions of the heat source and waste heat generated from powering the solid-state cooling sub-units; and
    a controller including an optimizer and configured to sample temperatures from an entirety of the plurality of sensor sub-units and route the sampled temperatures to the optimizer to observe at least one first hot spot;
    an electrical energy storage device configured to be dynamically charged and discharged;
    wherein, based on the sampled temperatures and the observed at least one first hot spot, the optimizer is configured to:
        predict at least one future second hot spot that has not yet formed based on the at least one observed first hot spot using one or more trained data-driven models;
        calculate recoverable power from temperature differentials created between the heat source and the solid-state cooling sub-units;
        predict a sequence of cooling intensity tensors that vary power and cooling cycle times of select cooling sub-units to cool the sub-regions of the heat source that correspond to the at least one first hot spot and the predicted at least one future second hot spot;
        determine from which of the one or more sub-regions of the heat source to route the recoverable power;
        generate output signals indicative of the predicted sequence of cooling intensity tensors to provide targeted cooling at the sub-regions of the heat source that correspond to the at least one first hot spot and the predicted future second hot spot; and
        charge the electrical energy storage device with the recoverable power.

2. The cooling system of claim 1, wherein the plurality of sensor sub-units are made of a material having anisotropic heat transfer properties oriented with the material plane of maximum heat transfer to thermally connect each sub-region of the heat source with one of the plurality of solid-state cooling sub units.

3. The cooling system of claim 1, wherein the one or more trained data-driven models makes predictions based on linear and non-linear transformations of the spatial and temporal distributions of temperatures.

4. The cooling system of claim 1, wherein the controller, based on the temperatures sampled from the plurality of sensor sub-units and predictions made by the optimizer, is further configured to store the temperatures sampled over a time interval, determine the amount of power which is applied to each of the solid-state cooling sub-units, determine a time interval over which the power is maintained and determine a future temporal step at which execution of a power charging cycle begins.

5. The cooling system of claim 1, wherein the plurality of sensor sub-units are formed on one or more sensor meshes and the plurality of solid-state cooling sub-units are formed on one or more cooler meshes, wherein the one or more sensor meshes and the one or more cooler meshes are stacked together and thermally connected.

6. The cooling system of claim 5, further comprising a mesh housing configured to receive the stacked one or more sensor meshes and the one or more cooler meshes and configured to hold the stacked one or more sensor meshes and the one or more cooler meshes in thermal contact with the heat source and the heat exchanger.

7. The cooling system of claim 1, wherein the plurality of sensor sub-units are connected to the heat source with a non-conductive thermal paste, the plurality of solid-state cooling sub-units are connected to the plurality of sensor sub-units with a non-conductive thermal paste and the plurality of solid-state cooling sub-units are connected to the heat exchanger with a non-conductive thermal paste.

8. A method of cooling a heat source comprising:
    providing a plurality of sensor sub-units arranged in a grid and thermally connected to a heat source, the heat source having a plurality of sub-regions that correspond with the plurality of sensor sub-units;
    providing a plurality of solid-state cooling sub-units arranged in a grid, each solid-state cooling sub-unit including a cold side and a hot side and each solid-state cooling sub-unit corresponding with one of the plurality of sensor sub-units;
    sampling, using a controller, temperatures of the plurality of sensor sub-units;
    routing the temperatures of each of the sensor sub-units to an optimizer to observe at least one first hot spot on the heat source;
    predicting at least one future second hot spot that has not yet formed based on the at least one observed first hot spot using one or more trained data-driven models;
    predicting a sequence of cooling intensity tensors that vary power and cooling cycle times of select solid-state cooling sub-units to cool the sub-regions of the heat source that correspond to the at least one first hot spot and the predicted at least one future second hot spot;
    predicting which of the one or more sub-regions to harvest waste heat from based on the predicted sequence of cooling intensity tensors;
    predicting how long charging cycles that harvest waste heat energy will be maintained;
    predicting when each charging cycle is to be executed in the future; and
    selectively cooling one or more sub-regions of the heat source by dynamically adjusting power to one or more of the solid-state cooling sub-units based on the predicted sequence of cooling intensity tensors that corresponds with the at least one observed first hot spot and the at least one predicted future second hot spot; and charging an electrical energy storage device based on the predicted charging cycles.

9. The method of claim 8, wherein selectively cooling one or more sub-regions of the heat source by dynamically adjusting power to one or more of the solid-state cooling sub-units based on the predicted sequence of cooling intensity tensors comprises generating an output signal of maximum power for select solid-state cooling sub-units that correspond with the observed hot spots and the predicted hot spots.

10. The method of claim 8, wherein selectively cooling one or more sub-regions of the heat source by dynamically adjusting power to one or more of the solid-state cooling sub-units based on the predicted sequence of cooling intensity tensors comprises generating an output signal corresponding to power required to cool a select solid-state cooling sub-unit to a temperature of nearest neighbors of the select solid-state cooling sub-unit.

11. The method of claim 8, wherein the one or more trained models of the optimizer makes predictions based on linear and non-linear transformations of the spatial and temporal distributions of temperatures.

12. A cooling system comprising:
a plurality of sensor sub-units configured to be thermally connected to a heat source, the heat source having a plurality of sub-regions that correspond with each of the sensor sub-units;
a plurality of solid-state cooling sub-units, each solid-state cooling sub-unit including a cold side and a hot side and each solid-state cooling sub-unit corresponding with one of the plurality of sensor sub-units, wherein the cold side of each solid-state cooling sub-unit thermally connects to one of the sensor sub-units and is configured to dissipate heat from the sub-regions of the heat source; and
a heat exchanger thermally connected to the hot side of each of the solid-state cooling sub-units and configured to dissipate additional heat from the sub-regions of the heat source and waste heat generated from powering the solid-state cooling sub-units; and
a controller including an optimizer and configured to sample temperatures from an entirety of the plurality of sensor sub-units over a time interval, route the sampled temperatures to the optimizer to observe at least one first hot spot and calculate power gained from temperature differentials between one two or more sensor sub-units;

wherein, based on the sampled temperatures, the optimizer is configured to:
predict at least one future second hot spot that has not yet formed based on the at least one observed first hot spot using one or more trained data-driven models;
predict a sequence of cooling intensity tensors to apply to select solid state cooling sub-units to cool the sub-regions of the heat source that correspond to the at least one first hot spot and the predicted at least one future second hot spot;
predict a sequence of charging cycle time tensors to apply to select solid-state cooling sub-units that correspond with the power gained from the calculated temperature differentials such that a difference in a power required to cool and the power gained is minimized;
generate first output signals indicative of the predicted sequence of cooling intensity tensors to provide targeted cooling of the sub-regions of the heat source that correspond with the at least one first hot spot and the predicted at least one future second hot spot; and
generate second output signals indicative of the predicted sequence of charging cycle times needed to route the power gained to an electrical energy storage device.

13. The cooling system of claim 11, wherein the temperatures sampled from the plurality of sensor sub-units are received by the controller through an input channel.

14. The cooling system of claim 12, wherein the controller routes an output signal through an output channel to cool the one or more solid-state cooling sub-units.

15. The cooling system of claim 12, wherein the plurality of sensor sub-units are arranged in at least one sensor mesh, the plurality of solid-state cooling units are arranged in at least one cooler mesh that are stacked together with the at least one sensor mesh and further comprising a mesh housing configured to receive the stacked one or more sensor meshes and the one or more cooler meshes and configured to hold the stacked one or more sensor meshes and the one or more cooler meshes in thermal contact with the heat source and the heat exchanger.

* * * * *